United States Patent
Harford

[15] 3,673,498

[45] June 27, 1972

[54] GAIN CONTROLLED CASCODE-CONNECTED TRANSISTOR AMPLIFIER

[72] Inventor: Jack Rudolph Harford, Flemington, N.J.

[73] Assignee: RCA Corporation

[22] Filed: May 19, 1970

[21] Appl. No.: 38,842

[52] U.S. Cl. ......................325/319, 178/7.3 DC, 178/7.3 E, 178/7.5 DC, 325/405, 325/409, 325/410, 330/28, 330/29, 330/38 M, 330/85, 330/86, 330/97, 330/129, 330/135, 330/144, 330/147

[51] Int. Cl. ......................................................H04b 1/16

[58] Field of Search.....................178/7.3 DC, 7.3 E, 7.5 DC; 307/299 A, 303; 317/148.5, 235 D, 235 Z; 325/319, 397, 399, 404, 405, 408, 409, 410; 330/17, 27, 28, 38 M, 76, 83, 85, 86, 89, 92, 100, 29, 67, 97, 129, 135, 144, 147

[56] References Cited

UNITED STATES PATENTS 3,564,125 2/1971 Avins ................................330/38 M

*Primary Examiner*—Albert J. Mayer
*Attorney*—Eugene M. Whitacre

[57] ABSTRACT

A gain controlled amplifier system suitable for use as an intermediate frequency television amplifier and adapted for construction in integrated circuit form. A gain controllable cascode amplifier arrangement includes a relatively high maximum gain, common emitter transistor coupled to one emitter of a double emitter, common base output transistor. The arrangement also includes a degenerated common emitter transistor having a smaller collector to substrate capacitance than that of the first common emitter transistor. The degenerated transistor is coupled to the second emitter of the output transistor. AGC and signals are supplied to the two common emitter transistors via an emitter follower. A feedback loop includes the resistor of the follower and is coupled to the inputs of the common emitter transistors to maintain fixed bias thereat upon reception of intermediate level signals and consequent cut off of the first common emitter transistor. The emitter follower acts as a gain control stage and ultimately as a varactor attenuator for high level signals.

20 Claims, 2 Drawing Figures

Figure 1:
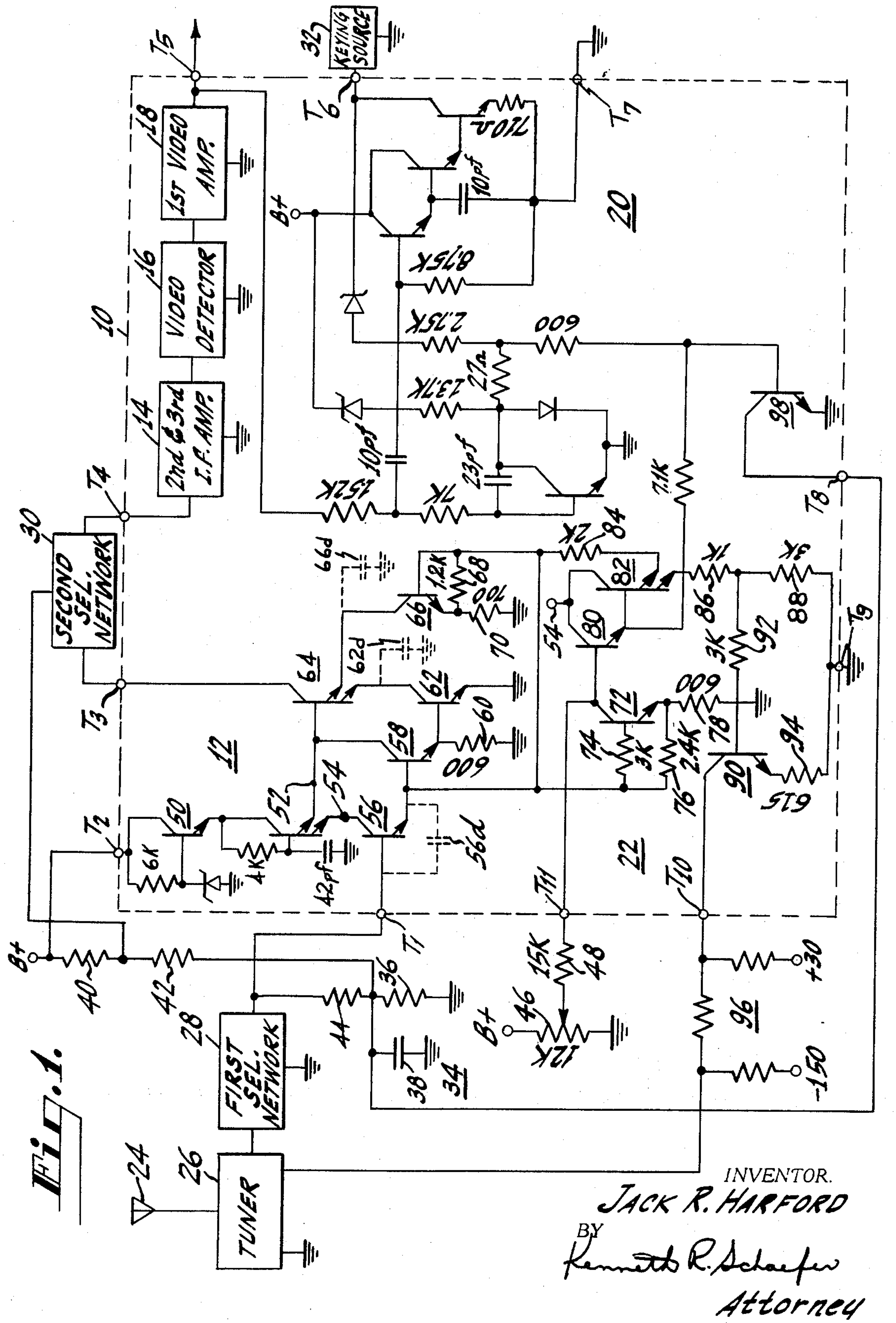

INVENTOR.
JACK R. HARFORD
BY
Kenneth R. Schaefer
Attorney

INVENTOR.
JACK R. HARFORD
BY
Kenneth R. Schaefer
Attorney

GAIN CONTROLLED CASCODE-CONNECTED TRANSISTOR AMPLIFIER

This invention relates, in general, to automatic gain control (AGC) systems for radio signal receiving apparatus and, in particular, to AGC systems for use in superherterodyne receivers incorporating intermediate frequency (I.F.) amplifiers fabricated using integrated circuit techniques.

Systems of this general type have been described in my earlier filed U.S. patent applications Ser. No. 766,905, filed Oct. 11, 1968, now abandoned in favor of continuation application Ser. No. 41,755 filed June 3, 1970, now U.S. Pat. No. 3,628,166 and Ser. No. 803,728, filed Mar. 3, 1969, now U.S. Pat. No. 3,579, 112. As noted in the latter patent, those systems are suitable for use in connection with an I.F. amplifier arrangement constructed in integrated circuit form in the manner described in U.S. patent application Ser. No. 803,544 of Jack Avins, filed March 3, 1969, now U.S. Pat. No. 3,564,125.

In each of the above-mentioned AGC systems, for a first range of relatively low received signal levels, the gain of one or more I.F. amplifier stages is varied so as to maintain a predetermined signal level at the output of an associated detector stage. For a second range of relatively high received signal levels, a dynamic attenuator network is controllably interposed in the signal path of the I.F. amplifier to maintain the desired detected signal output level. My AGC system U.S. Pat. No. 3,579,112 describes a further improvement whereby a delay or threshold circuit employed to initiate attenuator operation also is employed to initiate, at an intermediate signal level, gain control of a preceding radio frequency (R.F.) amplifier stage.

In each case, the AGC systems are arranged to control the gain of the signal amplifying stages so that a predetermined, substantially constant, peak signal level is provided at the output of an associated detector for a wide range of received signal levels. The transition of gain control from the I.F. to the R.F. amplifier stages (i.e., the R.F. AGC delay region) is selected so as to maintain an acceptable signal to noise ratio of the detected signal as received signal level varies. That is, the gain of the R.F. stage is not reduced until the received signal is of sufficient amplitude that the noise contribution of the R.F. stage (and any networks which precede it) is insignificant compared to the received signal level. In a television receiver, acceptable signal to noise ratio may be determined by electrical measurement or, on a subjective basis, by viewing the image produced on the kinescope.

Thus, when the received signal level is low, the R.F. stage is in a relatively high gain condition and remains in that condition as the I.F. stage is gain controlled. The signal to noise ratio of the detected signal then will be determined by the noise figure of the receiver R.F. stage. However, under strong signal conditions, when the gains of the R.F. and I.F. amplifier stages are relatively low and may even be reduced to unity, internal noise sources within such circuits can affect the signal to noise ratio of the detected video signal.

In the particular case of a color television receiver, even more stringent requirements may be encountered with respect to the signal to noise ratio of the relatively high frequency chrominance signal components. AGC systems of television receivers customarily are arranged so that the peak to peak amplitude of low frequency synchronizing signals are maintained at a predetermined level at the output of the video detector. Normally, this sync tip level bears a fixed relationship to the maximum chrominance signal level and the AGC system operates to provide satisfactory signal to noise ratio of both luminance and chrominance components. However, in mass production of color television receivers, the frequency selectivity (i.e., bandpass characteristics) of the R.F. and I.F. stages may depart from the desired nominal response to both low frequency (sync and luminance) and high frequency (chrominance) signal components. Furthermore, because of the relatively wide frequency difference of such signal components, different transmission and reception conditions (e.g., multipath reflections, different cable impedances on wired systems, antenna impedance variations, etc.) may be encountered by the low and high frequency portions of a given received signal. Thus, for example, the chrominance signal component of the received signal may be processed with a gain which is less than that provided for the lower frequency components to which the AGC system responds. Where the received signal is relatively strong but the chrominance component is reduced relative to luminance, the AGC system of the receiver operates so as to reduce the gain of the amplifier stages to such an extent that, while the luminance signal to noise ratio is adequate, the chrominance signal to noise ratio may be unacceptable. Colored noise may therefore appear on the kinescope during reception of color program material.

In order to avoid the problems associated with the above-described conditions, as well as to provide a relatively wide signal level handling range in a receiver employing automatic gain control, attention must be paid to possible noise sources within the signal amplifier chain beyond the input stage. In particular, in the environment of an AGC system intended for use with an I.F. amplifier constructed in integrated circuit form, where the gain range of individual stages and signal level handling capabilities are restricted, possible sources of noise in gain controlled I.F. amplifiers should be minimized.

In accordance with one aspect of the present invention, an intermediate frequency amplifier, adapted for construction in integrated circuit form, is arranged for automatic gain control operation over a range from a relatively high gain to a gain equal to or less than unity. The integrated circuit structure and the resulting circuit configuration are arranged to provide a low noise figure for such low gain operation.

In a preferred application of the principles of the present invention, a gain controlled I.F. amplifier comprises a cascode arrangement of a relatively high gain grounded emitter first input transistor and a grounded base output transistor. A second input transistor is also coupled to the grounded base transistor and is arranged in a degenerated common emitter configuration for providing substantially unity gain. Signals and AGC potential are supplied to each of the first and second transistors such that, for low signal levels, relatively high controllable gain is provided by the cascode configuration including the first input transistor. For higher signal levels, the gain of the first transistor is reduced ultimately to zero and the cascode configuration includes only the second input transistor and the output transistor, thereby providing substantially unity gain. Furthermore, the physical size and geometry of the first and second input transistors are selected to provide a relatively wide gain range while presenting a relatively small capacitance load to the grounded base transistor under low gain conditions.

In accordance with a further aspect of the invention, the gain of the I.F. amplifier is capable of reduction below unity gain by attenuator action. Such attenuator action is provided by means of a fourth transistor coupled to supply input signals to the first and second transistors. The fourth transistor is arranged to operate, when reverse-biased, as a variable capacitor or varactor to provide, in conjunction with an associated impedance, a controllable voltage divider across the inputs of the first and second input transistors.

Figure 2:
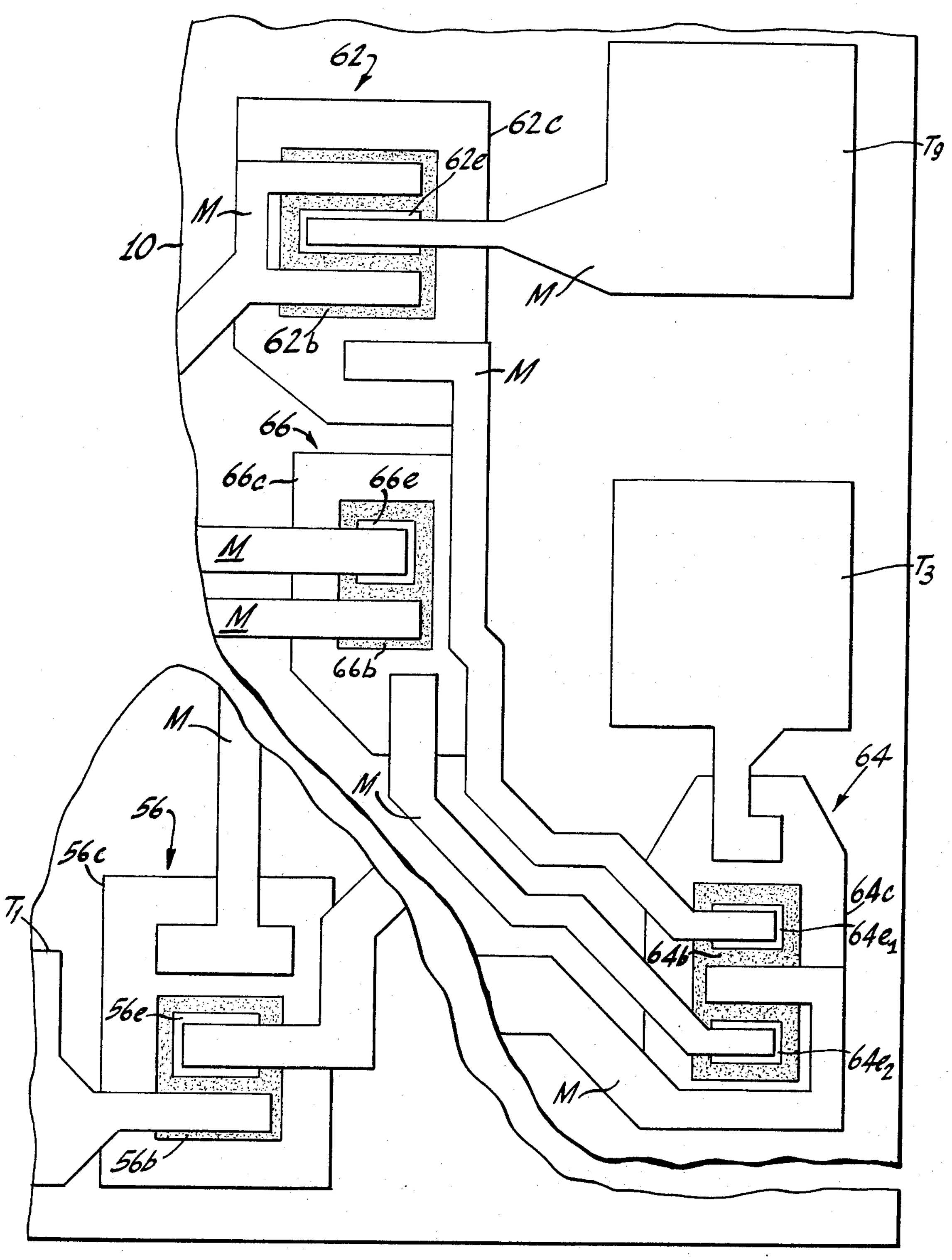

For a better understanding of the present invention together with various objects thereof, reference should be made to the following specification and the attached drawing in which:

FIG. 1 illustrates, partially in block diagram and partially in schematic diagram form, a portion of a television receiver constructed in accordance with the present invention; and FIG. 2 illustrates in topological form, a portion of an intermediate frequency amplifier arrangement constructed as an integrated circuit in accordance with certain aspects of the present invention.

Referring to FIG. 1, the dashed line rectangle 10 schematically represents a monolithic semiconductor integrated circuit chip. The chip 10 has a plurality of contact areas or terminals ($T_1$–$T_{11}$) about its periphery through which connections may be made from the internal circuitry of chip 10 to external elements. As is described in the above-identified Avins U.S. Pat. No. 3,564,125, chip 10 includes a first I.F. amplifier indicated generally by the reference numeral 12, second and third I.F. amplifiers 14, a video detector 16, a first video amplifier 18, an AGC potential source indicated generally by the reference numeral 20, and an R.F. AGC delay circuit indicated generally as 22.

In a television receiver employing the chip 10, modulated carrier wave television signals are received by an antenna 24 and are coupled to a television tuner 26. Tuner 26, which typically includes an R.F. amplifier and a frequency converter, performs the conventional functions of selectively amplifying a desired one of various received R.F. television signals and converting the selected R.F. signal to an intermediate frequency (I.F.) signal. The R.F. amplifier of tuner 26 is arranged for gain control in a conventional manner compatible with the AGC system to be described below.

Amplified intermediate frequency signals are coupled by means of a first frequency selective network 28 and an I.F. input terminal $T_1$ of chip 10 to first I.F. amplifier 12. A second frequency selective network 30, also external to chip 10, is coupled between the output of amplifier 12 and the input of second I.F. amplifier 14 via chip terminals $T_3$ and $T_4$.

The amplified intermediate frequency output of third I.F. amplifier 14 is coupled to video detector 16, the latter operating to recover image-representative and synchronizing signal components from the intermediate frequency signals. The output of video detector 16 is amplified in a first video amplifier 18 and the amplified image and synchronizing components are coupled via chip terminal T5 to additional conventional television signal processing apparatus external to chip 10.

Video amplifier 18 also supplies signals to AGC potential source 20, the general operation of which is described in my U.S. patent application Ser. No. 803,590, filed Mar. 3, 1969, now abandoned. Additional aspects of AGC potential source 20 are also described in my U.S. patent application Ser. No. 39,018 filed May 20, 1970 which is a continuation of abandoned application Ser. No. 803,590. AGC source 20 operates as a keyed AGC system and, to accomplish this end, is supplied via chip terminal T6 with keying pulses from a keying pulse source 32 such as a horizontal deflection output transformer (not shown) of the television receiver. AGC source 20 is coupled via chip terminal T8 to an external AGC filter network 34 comprising the parallel combination of a resistor 36 and a capacitor 38. A source of voltage (B+) is also coupled via the series combination of resistor 40 and resistor 42 to filter network 34. Negative feedback is provided from the output of I.F. amplifier 12 via frequency selective network 30 to the input of amplifier 12 (i.e., via the junction of resistors 40, 42). AGC voltage produced across filter network 34 is coupled via a resistor 44 to I.F. input terminal T1 for gain control of first I.F. amplifier 12 as will be explained below. Appropriate AGC voltage is also coupled, as will be explained below, via delay network 22 and chip terminal T10 to the R.F. amplifier of tuner 26. An external AGC delay control comprising a variable resistor 46 coupled across a suitable voltage source (e.g., B+) is coupled via a resistor 48 and chip terminal T11 to delay network 22.

Ground terminals T7 and T9 are provided, respectively, for the high and low signal level portions of chip 10.

Operating voltage (B+) is supplied to various portions of the circuitry included within chip 10 via terminal T2 and, typically, is of the order of 11 volts. First I.F. amplifier 12 is supplied with relatively noise-free operating voltage by means of a dynamic noise filter 50 coupled to terminal T2. Noise filter 50 is described in my U.S. Pat. No. 3,579,112 and supplies substantially identical but de-coupled voltages at circuit terminals 52 and 54.

In the illustrated circuitry within chip 10, the intermediate frequency signals supplied by frequency selective network 28 and the AGC voltage supplied by filter network 34 at terminal T1 are directly applied to the base of an input transistor 56 arranged in a Darlington configuration with a subsequent emitter follower transistor 58. The base-emitter capacitance associated with transistor 56 is shown in dotted lines and is designated by the reference numeral 56*d*. As will be explained below, for high signal input conditions, capacitor 56*d* is varied as a function of AGC voltage and serves as an attenuator in conjunction with the resistance which appears between the emitter of transistor 56 and ground. A load resistor 60 is connected between the emitter of follower transistor 58 and ground.

Signals appearing across load resistor 60 are coupled to the base of a grounded emitter transistor 62 which is disposed in a cascode arrangement with a double emitter transistor 64 to form a high gain amplifying stage for supplying amplified I.F. signals to subsequent stages via the second frequency selective network 30. Operating potential (B+) is supplied to transistor 64, for example through network 30. Transistor 62 is a relatively large area device having a relatively high maximum transconductance (gm) which can be varied as a function of AGC biasing voltage applied from terminal T1. In the illustrated circuit, reverse AGC is utilized. That is, the gain of transistor 62 is reduced by decreasing the positive bias voltage supplied to its base from terminal T1 via transistors 56 and 58.

The emitter of input transistor 56 is also directly coupled to the base of a transistor 66, the collector electrode of which is coupled to the second emitter of transistor 64. A bias voltage divider comprising resistors 68 and 70 is coupled between the base of transistor 66 and ground. The junction of resistors 68 and 70 is connected to the emitter of transistor 66. The biasing resistors 68 and 70 are selected so that transistor 66 is biased for conduction under all conditions where transistor 62 conducts and, furthermore, as will appear below, for conditions when transistor 62 is cut off. Transistor 66 is a relatively small area device. Transistors 66 and 64 form a low gain (e.g., unity gain) cascode amplifier stage for coupling high level I.F. input signals from transistor 56 to subsequent stages as will appear below.

In addition to means providing gain variations of the cascode-connected first I.F. amplifier stage (transistors 62, 64, 66) for relatively low signal level conditions, means are also provided for varying the gain of the R.F. amplifier of tuner 26, for varying the transconductance of transistor 56 and for providing attenuator operation of transistor 56 for higher received signal level conditions.

To this end, the emitter of input transistor 56 is coupled to AGC delay network 22. Specifically, the base of a transistor 72 is coupled via a resistor 74 to the emitter of transistor 56. The input (base-emitter) of transistor 72 is substantially in parallel with the input of transistor 66 and is biased by means of a voltage divider comprising resistors 76 and 78. Operating voltage is supplied to the collector of transistor 72 by means of the external AGC delay control comprising resistors 46, 48 and the B+ supply. Bias and operating voltage parameters associated with transistor 72 are selected such that, under no signal or relatively weak signal conditions transistor 72 is maintained in saturation conduction.

A Darlington-connected pair of transistors 80, 82 coupled to the collector of transistor 72 is held cut off for such weak signal conditions. Transistor 82 is a double emitter transistor having one emitter coupled via a resistor 84 to the bases of transistors 58 and 66 and a second emitter coupled to a voltage divider comprising resistors 86 and 88. Resistor 84, as will appear below, in combination with capacitor 56*d*, provides attenuator operation for strong signal conditions and also serves, for medium and strong signal conditions, to close a negative feedback loop to the base of transistor 72. Under medium and strong signal conditions, the applied AGC voltage causes transistor 72 to come out of saturation. The collector voltage of transistor 72 then rises, causing transistors 80 and 82 to conduct. The voltage divider 86, 88 is selected such that when a predetermined level of AGC voltage (i.e., signal level) is reached, a further transistor 90 conducts and supplies suitable AGC voltage to tuner 26. A base resistor 92, an emitter resistor 94 and an external collector voltage level translating network 96 coupled to terminal T10 are associated with transistor 90.

The illustrated AGC potential source 20 is described in detail in the above-referenced applications. For purposes of the present invention, it is sufficient to state that transistor 98 of AGC source 20 is arranged to discharge AGC filter capacitor 38 when the video output level of video amplifier 18 exceeds a predetermined level. The reduction of AGC voltage causes the gain of appropriate ones of the I.F. and R.F. amplifier elements to be reduced. If the video output level decreases below the desired level (e.g., signal fading), capacitor 38 is charged positively from the B+ supply via resistors 40 and 42 to increase the signal gain of the appropriate amplifying elements.

The manner in which the previously described circuitry operates to provide the desired AGC characteristics will now be described by considering the sequence of operations as received signal level is increased from no signal to a maximum signal input level.

When the received signal level is zero, tuner 26 and I.F. amplifier 12 are operated at maximum gain. That is, AGC capacitor 38 charges to a relatively high positive voltage, transistors 56, 58, 62, 64 and 66 are all biased for maximum gain and transistor 72 is biased to saturation. Transistors 80, 82 and 90 are cut off. As received signal strength increases, the signals are amplified by the active elements preceding detector 16 and their level is sensed at AGC source 20. When a predetermined, acceptable video signal level is reached, AGC source 20 begins to operate to decrease the AGC voltage supplied to terminal T1. The gain of transistor 62 is thereafter decreased so as to maintain the video signal output at its predetermined desired level. During this low input signal level portion of the AGC operating characteristic, transistor 66 is conducting but, since it provides only substantially unity gain, its contribution to the signal supplied to grounded base transistor 64 is insignificant compared to that supplied by the high gain (e.g., gm=0.05 mho) transistor 62. Furthermore, since transistor 72 is saturated, tuner 26 is operated at maximum gain.

As the received signal level increases and the AGC voltage supplied to terminal T1 becomes less positive, the gain of transistor 62 is decreased, for example, at a rate of 6 db for each 20 millivolts of AGC voltage change. When the AGC voltage decreases to a sufficiently low positive level, transistor 72 comes out of saturation, causing transistors 80 and 82 to conduct. Transistors 72, 80 and 82 then provide a negative feedback function which tends to stabilize the input to transistors 66 and 58 (and therefore to transistor 62). The biasing resistors 68, 70, 76 and 78 are selected so as to provide the desired mode transition before transistor 62 is driven to cut off.

Any further increase in signal level and resulting decrease in AGC voltage level produces very little change in gain of the cascode amplifier 62, 64, 66. The AGC transistor 98 therefore conducts heavily to reduce the AGC voltage across capacitor 38 at a more rapid rate. Since transistors 80 and 82 are conducting, AGC voltage is transferred, after division by resistors 86, 88 and translation by network 96 to the R.F. amplifier of tuner 26. Transistor 62 passes through a low gain, distortion producing condition to cut off at this time. However, the transition occurs rapidly and transistor 64 provides a substantially distortion-free main output current component to overcome any adverse effect of such distortion. The cascode amplifier 64, 66 operates in a relatively fixed, substantially unity gain condition for any further increases in signal.

As signal level increases further the AGC voltage across capacitor 38 continues to decrease. The gain of the tuner 26 is thereby decreased until the R.F. amplifier is reduced to its minimum gain condition. At that time the direct AGC voltage supplied to terminal T1 is sufficiently low as to affect the transconductance of input transistor 56, the emitter of which is clamped by the feedback circuit 72, 80, 82. For further increases in signal level, the gain of tuner 26 remains at a minimum while the transconductance of input transistor 56 is reduced until transistor 56 reaches a cut off condition.

At this time, the base-emitter capacitance **56*d* of transistor 56 serves to provide, in conjunction primarily with resistor 84, a voltage divider or signal attenuator operation. The reverse biased junction capacitance 56*d* acts as a varactor, the capacitance of which decreases as the applied AGC voltage becomes less positive. At the signal frequencies in question (i.e., approximately 50 MHz), this capacitive change is sufficient to provide a desired attenuation characteristic for very high input signal levels. The overall gain of the first I.F. amplifier stage between input terminal T1 and terminal T4 (the input to second I.F. amplifier 14) is reduced under these conditions to less than unity. It should also be noted that the gain of tuner 26 is substantially unity. Therefore, the signal to noise ratio of detected signals is affected by any noise source up to and including I.F. amplifier 12**.

The manner in which a portion of integrated circuit chip 10 is constructed to avoid noise problems will now be explained in connection with FIG. 2 which shows a topological view of chip 10 including several transistors, 56, 62, 64 and 66, terminals T1, T3 and T9 and conductive interconnections associated with such components. The manner in which the illustrated structure is fabricated is well known and will not be described in detail. For purposes of the present invention, it is sufficient to state that the chip 10 is made of semiconductor material, preferably silicon, of N type conductivity. The N type material is formed, for example, as an epitaxial layer on a P type substrate. Isolation regions are formed for collector "-boats" by diffusing P+ regions through the N type material to the P type substrate.

Each of the illustrated transistors 56, 62, 64 and 66 is formed in a separate collector boat (not shown) by diffusion of the aforementioned P+ isolation around the periphery of each of the collector regions **56*c*, 62*c*, 64*c*, 66*c*. Base diffusions 56*b*, 62*b*, 64*b* and 66*b* of P type material (shown lightly stippled) are formed in each of the respective collector regions and, subsequently, corresponding emitter regions of N type material 56*e*, 62*e*, 64*e*, $64e_2$ and 66*e* are formed by diffusion. The transistors are interconnected in accordance with the schematic diagram of FIG. 1** by a metallization pattern (segments of which are designated M) which is applied in a conventional manner over an oxide layer (not shown) having openings at the appropriate contact areas of the transistors and other components.

Transistor 62 is constructed, as noted in connection with FIG. 1, as a device having a controllable, relatively high maximum transconductance at the operating intermediate frequencies (of the order of 45 MHz). As such, the area of collector region **62*c* is relatively large. Furthermore, the base region 62*b* is provided with two metallization contacts M, one adjacent each side of emitter region 62*e*** to provide the desired high gain characteristics as is well known.

Transistor 66 on, the other hand, is a relatively small geometry device having a collector region **66*c* (one edge of which is hidden by metallization M but is in line with the corresponding edge of collector 62*c*), which is of smaller area than collector region 62*c*. A relatively small base area 66*b* having a single contact and a correspondingly small emitter area 66*e* are also provided. The area each of the transistors 62 and 66 determines a capacitance between the N type collector region of the transistor and the adjacent P type substrate. The devices are drawn to scale to illustrate the difference in size, the scale being such that the terminal T1, in the actual chip, is 4 mils by 4 mils. Terminal T9 is formed by means of a P+ diffusion connected to the P type substrate. The metallization M connected to terminal T9 is also connected externally of the chip to ground as shown in FIG. 1. Each of transistors 62 and 66 therefore exhibits a predetermined capacitance between collector and ground, the capacitance of the larger area device 62 being approximately twice the capacitance of the smaller area device 66. This characteristic of the transistors 62, 66** is of particular significance in connection with their operation in the large signal, low I.F. gain portion of the circuit characteristics described above.

That is, as stated above in connection with FIG. 1, as the received signal level increases, the AGC voltage supplied from filter network 34 via terminal T1 becomes less positive. The gain of transistor 62 is reduced and, eventually, such gain approaches the unity gain level associated with transistor 66. As this gain reduction of transistor 62 takes place, since transistors 62 and 64 are coupled in series relation, the emitter impedance of each of transistors 62 and 64 increases in a similar manner (e.g., from approximately 10 ohms to 1,000 ohms). The collector to substrate capacitance of transistor 62 is such that the impedance which it presents at the operating frequency (e.g., approximately 45 MHz) is also of the order of 1,000 ohms. Therefore, since the emitter impedance of transistor 64 and the impedance of the collector to substrate capacitance of transistor 62 are of the same order of magnitude, a substantial portion (approximately one-half) of the signal current supplied by transistor 62 is shunted to its collector to substrate capacitance. At the same time, that capacitance also acts as an emitter load impedance for internal noise generated by transistor 64. The combined effect of the reduction of signal supplied to transistor 64 and increase in its noise contribution serves to degrade the signal to noise ratio of the I.F. amplifier 12 (which is, at this time, operating at gains in the vicinity of unity). In order to eliminate this additional noise source, the second input transistor 66 is provided. As the gain of transistor 62 is reduced to the above-described low level and transistor 62 approaches cut off, the rate at which the gain of I.F. amplifier 12 changes (i.e., db gain change per millivolt of AGC potential change) decreases substantially. The AGC system operates, as signal level increases, to drive transistor 62 rapidly to cut off. The emitter of transistor 64, which is coupled to the collector of transistor 62, therefore is not biased for conduction and the collector to substrate capacitance of transistor 62 is effectively disconnected from the operating circuit. The relatively small collector to substrate capacitance of transistor 66 does not cause the degradation of signal to noise ratio encountered with the larger capacitance of transistor 62. Signal to noise performance of the receiver is therefore improved.

As noted above in connection with FIG. 1, transistor 56 operates to provide a base to emitter capacitance which, under reverse bias conditions, varies inversely with the applied reverse bias. The geometry of transistor 56 which provides this desired characteristic is illustrated in FIG. 2. The capacitance variation is of the order of several picofarads which in combination with the resistance including resistor 84 is sufficient to provide attenuation of high level input signals which would otherwise overload I.F. amplifier 12.

While the invention has been described in terms of a preferred embodiment, various modifications may be made within the scope of the invention. For example, while transistor 64 has been illustrated as a single device having a double emitter construction, maybe constructed as two separate transistors having their bases connected together, their collectors connected together and their respective emitters connected to the collectors of transistors 62 and 66.

I claim:

1. In a radio signal receiver having a tuner for selective amplification of received radio frequency signals and for conversion thereof to intermediate frequency signals and having automatic gain control means for providing a gain control potential responsive to received signal level, a controllable signal amplifier comprising:

the combination of a first transistor arranged in a common emitter configuration and having a collector electrode and output transistor means having at least a first emitter electrode coupled to said collector electrode, a collector electrode adapted for connection to a signal load and a second emitter electrode, a second transistor arranged in a degenerated common emitter configuration and having a collector electrode coupled to said second emitter electrode, said second transistor providing a lower capacitance at its collector electrode than said first transistor input circuit means for coupling said gain control potential and signals to be amplified to said combination and for coupling at least said gain control potential to said second transistor, and biasing means coupled to said second transistor for maintaining said second transistor conductive when said first transistor is conductive and non-conductive.

2. A signal amplifier in accordance with claim 1 wherein said first transistor exhibits a relatively high, maximum transconductance, said output transistor means comprises a third transistor having first and second separate emitter electrodes and arranged in a common base configuration, the combination of said first and third transistors comprises a first cascode amplifier exhibiting a relatively high maximum gain variable in response to gain control potential supplied to said first transistor, and the combination of said second and third transistors comprises a second cascode amplifier exhibiting relatively low gain.

3. A signal amplifier in accordance with claim 2 wherein said input circuit means couples gain control potential and signals to each of said first and second transistors.

4. A signal amplifier in accordance with claim 3 wherein said first transistor is responsive to gain control potentials corresponding to received signal levels exceeding a predetermined limit for passing from a conductive to a non-conductive state.

5. A signal amplifier in accordance with claim 4 wherein said second cascode amplifier provides substantially unity gain when said first transistor is non-conductive.

6. A signal amplifier in accordance with claim 5 wherein each of said second and third transistors further includes a base electrode coupled to said input circuits means, and said biasing means comprises a resistive voltage divider coupled between the base of said second transistor and a point of reference potential, a point on said divider being coupled to the emitter of said second transistor.

7. In a radio signal receiver having a tuner for selective amplification of received radio frequency signals and for conversion thereof to intermediate frequency signals and having automatic gain control means for providing a gain control potential responsive to received signal level, the combination comprising:

intermediate frequency amplifying means having a gain which is variable with applied gain control potential, negative feedback circuit means including a resistor and a sensing transistor coupled to said amplifying means and operative in response to a gain control potential of a predetermined level at said amplifying means for opposing variations in said level, and input circuit means for coupling signals to be amplified and for coupling gain control potential to said amplifying means, said input circuit means comprising a transistor coupled in an emitter follower arrangement with said resistor, said emitter follower transistor being forward biased for relatively low received signal levels and being reverse biased for relatively high received signal levels above signal levels corresponding to said gain control potential of predetermined level, the combination of said emitter follower transistor and said resistor providing a variable capacitance-resistance attenuator network for said relatively high received signal levels.

8. The combination according to claim 7 wherein said emitter follower transistor includes a base-emitter junction for providing said variable capacitance in response to applied gain control potential exceeding said predetermined level in a sense to reverse bias said junction.

9. The combination according to claim 8 wherein said variable capacitance decreases in response to application of gain control potential variations corresponding to increases in received signal levels.

10. The combination according to claim 7 wherein said emitter follower transistor provides a decreasing transconductance for signal levels intermediate said low and high levels to provide additional gain control of signals supplied to said amplifying means.

11. The combination according to claim 10 wherein said negative feedback means further comprise means responsive to said predetermined level of gain control potential for coupling at least a portion of said gain control potential to said tuner to vary the gain thereof for signal levels intermediate said low and high levels.

12. An integrated circuit comprising a body of semiconductor material, means in said body defining at least first, second and third transistors, said first and second transistors each having base, emitter and collector regions and said third transistor having a base, collector and two emitter regions, the area of the collector region of said first transistor being greater than the area of the collector region of said second transistor, conductive means for connecting said collector of said first transistor to one emitter of said third transistor, for connecting said collector of said second transistor to the other emitter of said third transistor, for connecting said base regions of said first and second transistors to input circuits and for connecting said collector region of said third transistor to an output circuit whereby the capacitance between said collector of said second transistor and said body is less than the capacitance between said collector of said first transistor and said body.

13. An integrated circuit according to claim 12 wherein said conductive means further comprises a conductive member for connecting said emitter of said first transistor to a reference potential common to said body of material.

14. An integrated circuit according to claim 13 wherein said first transistor comprises a relatively large base region and said conductive means comprises a plurality of base connectors and at least one emitter connector between adjacent ones of said base connectors to provide substantial transconductance at frequencies of the order of 50 megahertz.

15. An integrated circuit according to claim 13 wherein the area of said collector region of said second transistor is of the order of one-half or less the area of said collector region of said first transistor.

16. A controllable signal amplifier comprising:

a first transistor arranged in a common emitter configuration and having input and output electrodes, a second transistor arranged in a degenerated common emitter configuration and having input and output electrodes, means for coupling signals to be amplified to said input electrodes, means for coupling said output electrodes to a common signal load impedance across which amplified signals are produced, and means for coupling a variable gain potential to said input electrodes for varying the gain of at least said first transistor from a relatively high gain to a gain less than that of said second transistor while maintaining said second transistor in conduction throughout said gain variation of said first transistor.

17. A controllable signal amplifier according to claim 16 wherein said means for coupling variable gain potential is arranged to vary the gain of said first transistor from a high gain to cut off while maintaining said second transistor conductive beyond cut off of said first transistor.

18. A controllable signal amplifier according to claim 17 wherein said input and output electrodes comprise, respectively, base and collector electrodes, and said degenerated common emitter configuration includes circuit means coupled to the emitter of said second transistor providing an impedance at the frequency of said signals to be amplified.

19. A controllable signal amplifier according to claim 18 wherein said input signals and said gain control potential are coupled from a common circuit point to said base electrodes of said first and second transistors.

20. A controllable signal amplifier according to claim 19 wherein said means for coupling said output electrodes to a common signal load impedance comprises common base transistor means coupled in cascode relation to said first and second transistors.

* * * * *